United States Patent
Takahashi et al.

(10) Patent No.: US 12,276,708 B2
(45) Date of Patent: Apr. 15, 2025

(54) ARC DETECTION SYSTEM, ARC DETECTION METHOD, AND RECORDING MEDIUM

(71) Applicant: Panasonic Intellectual Property Management Co., Ltd., Osaka (JP)

(72) Inventors: Tatsuya Takahashi, Tokyo (JP); Tatsuo Koga, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 115 days.

(21) Appl. No.: 18/249,475

(22) PCT Filed: Oct. 5, 2021

(86) PCT No.: PCT/JP2021/036843
§ 371 (c)(1),
(2) Date: Apr. 18, 2023

(87) PCT Pub. No.: WO2022/091715
PCT Pub. Date: May 5, 2022

(65) Prior Publication Data
US 2023/0384398 A1   Nov. 30, 2023

(30) Foreign Application Priority Data
Oct. 29, 2020 (JP) .................... 2020-181390

(51) Int. Cl.
*G01R 31/58* (2020.01)
*H04B 3/46* (2015.01)

(52) U.S. Cl.
CPC ............... *G01R 31/58* (2020.01); *H04B 3/46* (2013.01)

(58) Field of Classification Search
USPC .......................................... 324/543
See application file for complete search history.

(56) References Cited

U.S. PATENT DOCUMENTS

2018/0233901 A1* 8/2018 Ashida .................... H02H 7/20

FOREIGN PATENT DOCUMENTS

| JP | 2011-007765 A | 1/2011 |
| JP | 2017-143667 A | 8/2017 |
| JP | 2020-025460 A | 2/2020 |

OTHER PUBLICATIONS

International Search Report issued on Dec. 21, 2021 in International Patent Application No. PCT/JP2021/036843, with English translation.

* cited by examiner

*Primary Examiner* — Farhana A Hoque
(74) *Attorney, Agent, or Firm* — Rimon P.C.

(57) ABSTRACT

An arc detection system includes a first obtainment unit, a second obtainment unit, and a determination unit. The first obtainment unit obtains a measurement result of current flowing in a power line to which power is supplied from a power supply or a measurement result of voltage in the power line. The second obtainment unit obtains operation information about operation of a device connected to the power line. The determination unit determines whether or not an arc fault has occurred in the power line based on the measurement result obtained by the first obtainment unit and the operation information obtained by the second obtainment unit.

7 Claims, 4 Drawing Sheets

ARC DETECTION SYSTEM, ARC DETECTION METHOD, AND RECORDING MEDIUM

CROSS-REFERENCE OF RELATED APPLICATIONS

This application is the U.S. National Phase under 35 U.S.C. § 371 of International Patent Application No. PCT/JP2021/036843, filed on Oct. 5, 2021, which in turn claims the benefit of Japanese Patent Application No. 2020-181390, filed on Oct. 29, 2020, the entire disclosures of which Applications are incorporated by reference herein.

TECHNICAL FIELD

The present invention relates to an arc detection system, an arc detection method, and a recording medium for determining whether or not an arc fault may possibly occur in a power line.

BACKGROUND ART

PTL 1 discloses an arc detection means for detecting arcs. The arc detection means includes a voltage detection means for measuring the voltage between the input side wiring to the terminal block and the output side wiring from the terminal block, and a current detection means for measuring the current in the output side wiring from the terminal block. The arc detection means differentiates between electrical noise, etc., and arcs on the terminal block by simultaneously detecting fluctuations in the voltage value in the voltage detection means and fluctuations in the current value in the current detection means.

CITATION LIST

Patent Literature

[PTL 1] Japanese Unexamined Patent Application Publication No. 2011-7765

SUMMARY OF INVENTION

Technical Problem

The present invention provides an arc detection system, an arc detection method, and a recording medium that facilitate the prevention of false detection of the occurrence of arc faults.

Solution to Problem

An arc detection system according to one aspect of the present invention includes a first obtainment unit, a second obtainment unit, and a determination unit. The first obtainment unit is configured to obtain a measurement result of current flowing in a power line to which power is supplied from a power supply or a measurement result of voltage in the power line. The second obtainment unit is configured to obtain operation information about operation of a device connected to the power line. The determination unit is configured to determine whether or not an arc fault has occurred in the power line based on the measurement result obtained by the first obtainment unit and the operation information obtained by the second obtainment unit.

An arc detection method according to one aspect of the present invention includes: obtaining a measurement result of current flowing in a power line to which power is supplied from a power supply or a measurement result of voltage in the power line; obtaining operation information about operation of a device connected to the power line; and determining whether or not an arc fault has occurred in the power line based on the measurement result obtained and the operation information obtained.

A non-transitory computer-readable recording medium according to one aspect of the present invention has recorded thereon a program for causing one or more processors to execute the arc detection method described above.

Advantageous Effects of Invention

One aspect of the present invention has the advantage that it is easy to prevent false detection of the occurrence of arc faults.

DESCRIPTION OF EMBODIMENTS

The following describes embodiments of the present invention with reference to the drawings. The embodiments described below each show a specific example of the present invention. The numerical values, shapes, materials, elements, the arrangement and connection of the elements, steps, the order of the steps, etc., indicated in the following embodiments are mere examples, and therefore do not intend to limit the present invention.

Note that the respective figures are schematic diagrams and are not necessarily precise illustrations. Additionally, like reference signs indicate like elements. As such, overlapping explanations of like elements are omitted or simplified.

Embodiment 1

Configuration

Figure 1:
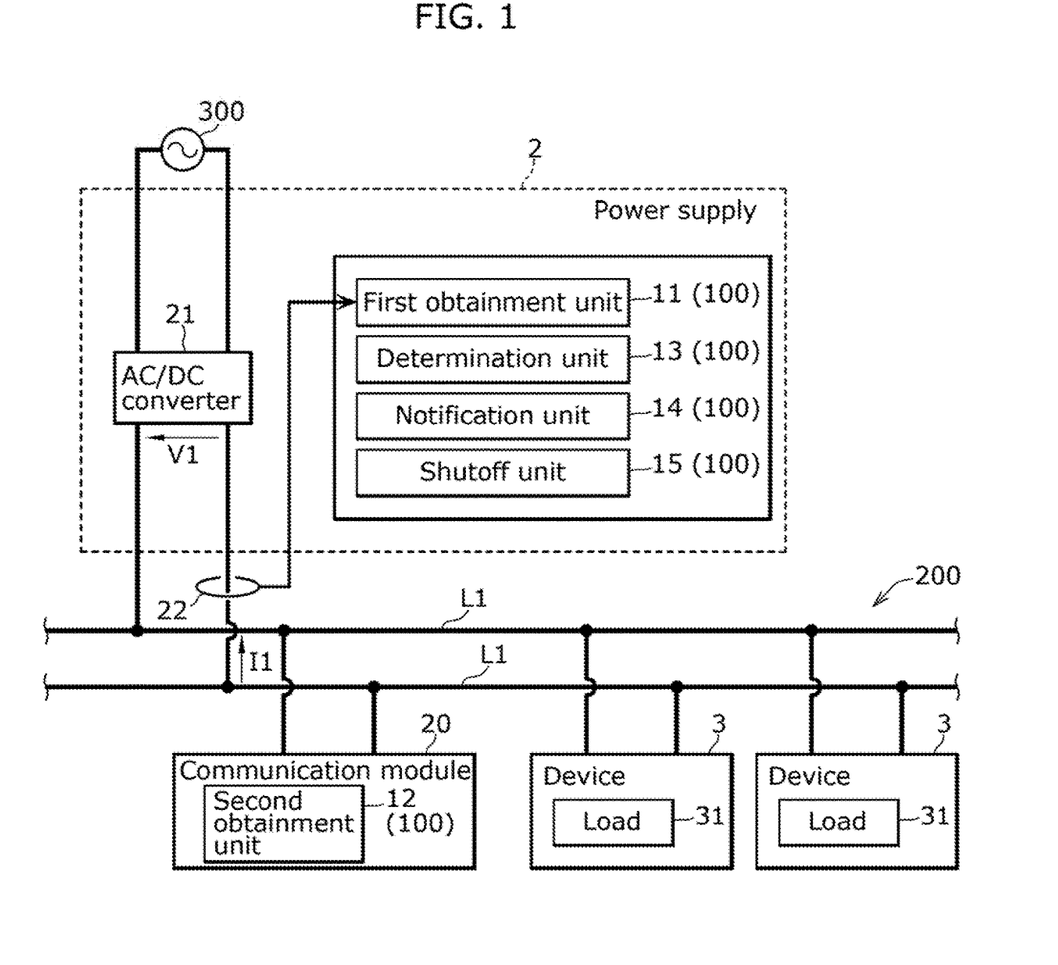
FIG. 1 is a diagram of the overall structure including an arc detection system according to Embodiment 1.

The arc detection system according to Embodiment 1 will be described with reference to FIG. 1. FIG. 1 is a diagram of the overall structure including arc detection system 100 according to Embodiment 1.

Arc detection system 100 is primarily a system for determining whether or not an arc fault has occurred in power line L1 to which power is supplied from the power supply 2. Stated differently, power line L1 may be damaged or broken by, for example, external factors or age-related deterioration, and arcing (arc discharge) may occur due to such damage, ultimately resulting in an arc fault. Arc detection system 100 is therefore primarily used to detect arc faults that may occur in power line L1.

More specifically, arc detection system 100 is used in what is known as direct current (DC) distribution network 200. DC distribution network 200 includes one or more power lines L1. FIG. 1 illustrates an example in which DC distribution network 200 includes only one power line L1. DC power is supplied to DC distribution network 200 from power supply (in this case, a DC power supply) 2. Each power line L1 includes a pair of power lines: a positive power line connected to the positive electrode on the output side of power supply 2 and a negative power line connected to the negative electrode on the output side of power supply 2.

Here, if DC distribution network 200 includes only one power line L1, DC power is supplied from power supply 2 to this power line L1. If DC distribution network 200 includes a plurality of power lines L1, one end of each power line L1 is connected to one or more branch points. Therefore, when DC power is supplied from power supply 2 to one of power lines L1, DC power is also supplied to the other power lines L1 through the one or more branch points.

In Embodiment 1, power supply 2 is a power converter including AC/DC converter 21. Power supply 2 converts AC power output from power grid 300 into DC power and outputs the converted DC power to power line L1 to which power supply 2 is connected. If DC distribution network 200 includes a plurality of power lines L1, the DC power output to the above-described power line L1 is also output to the other power lines L1. In Embodiment 1, power supply 2 may be configured to output DC power, and may be a distributed power supply such as solar cells, a power supply such as storage batteries, or a combination of these power supplies and a power converter (for example, a power converter that includes a DC/DC converter circuit).

Each power line L1 is configured as a duct rail, for example, to which one or more devices 3 can be attached. Stated differently, one or more devices 3 can be arranged in any position on each power line L1. Each power line L1 may of course be configured such that locations where one or more devices 3 can be attached are defined in advance. In Embodiment 1, each power line L1 is located on the ceiling of a facility, but each power line L1 may be located on the floor, a wall, or a fixture in the facility.

Device 3 includes load 31 and a pair of connecting terminals. Device 3 also includes a function for communicating with second obtainment unit 12 (described below) of arc detection system 100. The communication function is realized when device 3 is operating. In other words, in Embodiment 1, device 3 can communicate with second obtainment unit 12 when device 3 is connected to power line L1, but cannot communicate with second obtainment unit 12 when it is not connected to power line L1.

Device 3 can be attached to or detached from power line L1 via the pair of connecting terminals. More specifically, when attaching device 3 to power line L1, device 3 is rotated clockwise or counterclockwise by a predetermined angle (for example, 90 degrees) in a view from the direction of insertion of device 3, with the pair of connecting terminals of device 3 inserted into the duct rail (power line L1). This fixes the pair of connecting terminals in place while they are in contact with a pair of connecting conductors provided in power line L1, thereby electrically and mechanically connecting device 3 to power line L1.

Device 3 is detached from power line L1 by rotating device 3 by a predetermined angle in a view from the direction of insertion of device 3, in the opposite direction from that described above. This releases the contact between the pair of connecting terminals and the pair of connecting conductors, enabling device 3 to be detached from power line L1. Load 31 is driven by the DC power supplied from power supply 2 via power line L1 when device 3 is attached to power line L1.

In Embodiment 1, device 3 is a lighting fixture, but device 3 may be, for example, a loudspeaker, a camera, a sensor, or a USB power delivery (PD). Stated differently, device 3 may be a device other than a lighting fixture as long as load 31 is driven by electric power. In Embodiment 1, all of devices 3 connected to power lines L1 are lighting fixtures, i.e., are of one type of device, but a plurality of types of devices 3 may be connected to power lines L1. For example, a lighting fixture, a loudspeaker, a camera, a sensor, and a USB PD may be connected to power lines L1. These devices 3 may be all connected to a single power line L1, or they may be connected separately to a plurality of power lines L1.

Arc detection system 100 includes first obtainment unit 11, second obtainment unit 12, determination unit 13, notification unit 14, and shutoff unit 15 as functional components for determining whether an arc fault has occurred. In Embodiment 1, first obtainment unit 11, determination unit 13, notification unit 14, and shutoff unit 15 are provided in power supply 2. Second obtainment unit 12 is provided in communication module 20, which is connected to power line L1, rather than in power supply 2. Communication module 20 is configured to communicate with power supply 2 by, for example, wireless communication or power line communication (PLC).

In each of power supply 2 and communication module 20, arc detection system 100 is, for example, a microcontroller or a device that includes a microcontroller. A microcontroller is a semiconductor integrated circuit, etc., that includes ROM in which a program is stored, RAM, a processor (a central processing unit (CPU)) that executes the program, a timer, an A/D converter, and a D/A converter. First obtainment unit 11, second obtainment unit 12, determination unit 13, notification unit 14, and shutoff unit 15 are all realized by the processor executing the above program.

First obtainment unit 11 obtains a measurement result of current I1 flowing in power line L1 or voltage V1 in power line L1 to which power is supplied from power supply 2. In Embodiment 1, first obtainment unit 11 obtains the measurement result of current I1 by sampling at predetermined intervals (i.e., on a sampling cycle) by current meter 22. Stated differently, first obtainment unit 11 obtains the measurement result of current I1 from current meter 22 at predetermined intervals. Current meter 22 is provided between power supply 2 and power line L1, and measures the current flowing in the negative power line of power line L1 (i.e., current I1 in power line L1). Current meter 22 may be built into power supply 2.

Second obtainment unit 12 obtains operation information about the operation of devices 3 connected to power line L1. Here, the operation information can include information that directly or indirectly indicates whether or not load 31 included in device 3 is receiving power and operating. In Embodiment 1, the operation information indicates the communication status with device 3. Stated differently, if second obtainment unit 12 is receiving signals from device 3 and can communicate with device 3, it will obtain operation information indicating that device 3 is connected to power line L1 and is operating. If, however, second obtainment unit 12 does not receive any signal from device 3 and is not able to communicate with device 3, it will obtain operation information indicating that device 3 is not connected to power line L1 and is not operating. The communication standard used for communication between second obtainment unit 12 and device 3 is not particularly limited. The communication between second obtainment unit 12 and device 3 may be wired, wireless, or power line communication.

In Embodiment 1, second obtainment unit 12 communicates at regular intervals (for example, every several hundred milliseconds) with devices 3 that are connected to power line L1 and operating. For example, second obtainment unit 12 may communicate with devices 3 by receiving signals unilaterally transmitted from devices 3 that are connected to power line L1 and operating. For example, second obtainment unit 12 may communicate with devices 3 by broadcasting a request signal containing a command requesting a reply and receiving a response signal from device 3 that received the request signal.

The signal transmitted from device 3 toward second obtainment unit 12 includes information identifying the source device 3. Arc detection system 100 is therefore able to know the operation information (in this case, communication status) for each device 3.

Determination unit 13 determines whether or not an arc fault has occurred in power line L1 based on components in a specific frequency band of the measurement result obtained by first obtainment unit 11 and the operation information obtained by second obtainment unit 12. More specifically, determination unit 13 performs a frequency analysis of the measurement result of current I1 obtained by first obtainment unit 11. Frequency analysis involves, for example, calculating the frequency spectrum of the measurement result of current I1 by calculating the Fourier transform (in this case, Fast Fourier Transform (FFT)) of the time waveform of the measurement result of current IL Determination unit 13 then refers to the calculated frequency spectrum and determines that an arc has occurred if the measurement result of current I1 contains a first predetermined value of specific frequency band components or more. The specific frequency band is, for example, a band that includes the frequency of noise generated when an arc occurs. In one example, the specific frequency band is the band of tens of kHz, which is a relatively high frequency band. Note that the frequency of the noise generated in the above case can be obtained experimentally.

Determination unit 13 then determines whether or not an arc fault has occurred in power line L1 by referencing not only the determination of whether or not an arc has occurred based on the measurement result obtained by first obtainment unit 11, but also the operation information obtained by second obtainment unit 12. In other words, determination unit 13 does not determine that an arc fault has occurred in power line L1 simply by determining that an arc has occurred based on the measurement result obtained by first obtainment unit 11. The following is an explanation of how the inventors came to determine the occurrence of arc faults in this manner.

There are two types of arcs that can occur in DC distribution network 200: arcs that result from a disconnection or partial disconnection in power line L1, and arcs that can occur momentarily when attaching or detaching device 3 to or from power line L1. Stated differently, if device 3 is not smoothly attached to power line L1, chattering—where load 31 in device 3 is repeatedly connected to and disconnected from power line L1 in a short period of time—can occur. While chattering is occurring, an arc can occur when load 31 is momentarily disconnected from power line L1 while current is flowing therethrough. Chattering can also occur when detaching device 3 from power line L1, as described above. While chattering is occurring, an arc can occur when load 31 is momentarily disconnected from power line L1 while current is flowing therethrough. The generation of arcs due to such chattering can occur not only in DC distribution network 200, but also in an alternating current (AC) distribution network. In particular, if device 3 is attached to power line L1 with an unsatisfactory distance between the electrodes of device 3 and the electrodes of power line L1, it is difficult for the arc to extinguish.

Here, arcs caused by a disconnection or partial disconnection in power line L1 tend to cause arc faults, while arcs caused by chattering are less likely to cause arc faults because they generally extinguish in a short period of time. It is therefore desirable for arc detection system 100 to ignore short duration arcs caused by chattering and primarily determine the occurrence of an arc caused by a disconnection or partial disconnection in power line L1 as the occurrence of an arc fault.

In view of this, in Embodiment 1, in order to satisfy the above requirement, determination unit 13 determines whether or not an arc fault has occurred in power line L1 as follows. Determination unit 13 first determines whether or not an arc has occurred based on a measurement result obtained by first obtainment unit 11. If determination unit 13 determines that an arc has occurred, it monitors the duration of the determination that an arc has occurred. If the duration is less than a first threshold, determination unit 13 determines that an arc fault has not occurred in power line L1, regardless of the operation information (in this case, the communication status) obtained by second obtainment unit 12. If the duration is greater than or equal to the first threshold and less than a second threshold, determination unit 13 determines whether or not an arc fault has occurred in power line L1 as described in the first determination example or the second determination example below. If the duration is greater than or equal to the second threshold, determination unit 13 determines whether or not an arc fault has occurred in power line L1 as described in the third determination example below. The first threshold and the second threshold are set in advance, for example, by the user of arc detection system 100.

Figure 2A:
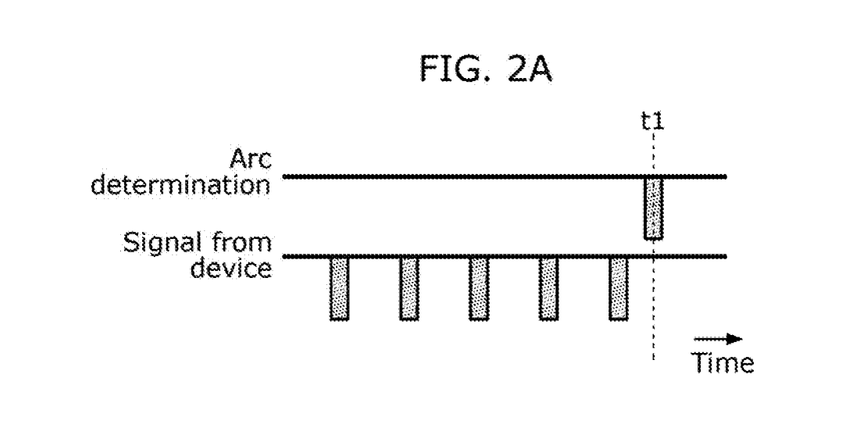
FIG. 2A is a timing chart illustrating a first determination example by a determination unit of the arc detection system according to Embodiment 1.
Figure 2B:
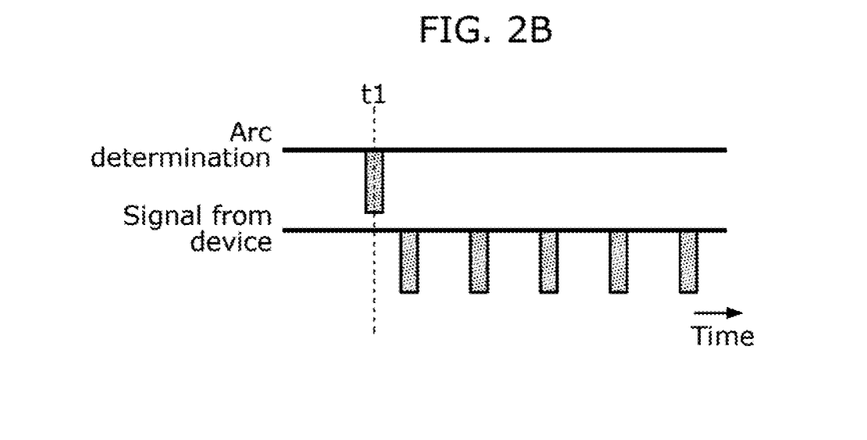
FIG. 2B is a timing chart illustrating a second determination example by the determination unit of the arc detection system according to Embodiment 1.
Figure 2C:
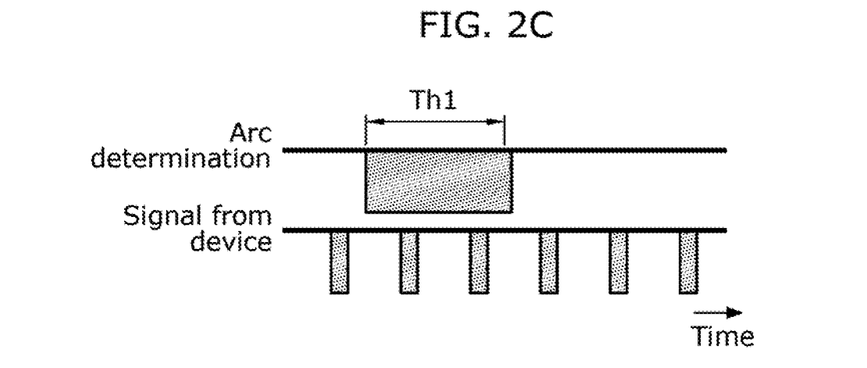
FIG. 2C is a timing chart illustrating a third determination example by the determination unit of the arc detection system according to Embodiment 1.

FIG. 2A is a timing chart illustrating the first determination example by determination unit 13 of arc detection system 100 according to Embodiment 1. FIG. 2B is a timing chart illustrating the second determination example by determination unit 13 of arc detection system 100 according to Embodiment 1. FIG. 2C is a timing chart illustrating the third determination example by determination unit 13 of arc detection system 100 according to Embodiment 1. In each of FIG. 2A through FIG. 2C, the pulses in the upper timing chart represent the duration of a determination that an arc has occurred by determination unit 13. In each of FIG. 2A through FIG. 2C, the pulses in the lower timing chart indicate that the signal from device 3 was received by second obtainment unit 12.

As illustrated in FIG. 2A, in the first determination example, second obtainment unit 12 periodically receives signals from device 3 prior to time t1, which is when determination unit 13 determines that an arc has occurred based on a measurement result obtained by first obtainment unit 11 (hereinafter also referred to as "determination time"

t1). However, in the first determination example, second obtainment unit 12 does not receive a signal from device 3 after determination time t1.

Therefore, in the first determination example, determination unit 13 determines that device 3 was detached from power line L1 at determination time t1 because the communication status obtained by second obtainment unit 12 changed from "available for communication" before determination time t1 to "unavailable for communication" after determination time t1. Determination unit 13 determines that the arc has occurred due to chattering, and determines that an arc fault has not occurred in power line L1. However, if the communication status obtained by second obtainment unit 12 remains "available for communication" before and after determination time t1, determination unit 13 determines that an arc caused by a disconnection or partial disconnection in power line L1 has occurred, i.e., that an arc fault has occurred.

As illustrated in FIG. 2B, in the second determination example, second obtainment unit 12 does not receive a signal from device 3 before determination time t1. However, in the second determination example, second obtainment unit 12 receives signals from device 3 after determination time t1.

Therefore, in the second determination example, determination unit 13 determines that device 3 was attached to power line L1 at determination time t1 because the communication status obtained by second obtainment unit 12 changed from "unavailable for communication" before determination time t1 to "available for communication" after determination time t1. Determination unit 13 determines that the arc has occurred due to chattering, and determines that an arc fault has not occurred in power line L1. However, if the communication status obtained by second obtainment unit 12 remains "unavailable for communication" before and after determination time t1, determination unit 13 determines that an arc caused by a disconnection or partial disconnection in power line L1 has occurred, i.e., that an arc fault has occurred.

Thus, in the first determination example and the second determination example, when determination unit 13 determines that an arc has occurred based on the measurement result obtained by first obtainment unit 11 and there is a difference in the communication status indicated in the operation information before and after the determination, determination unit 13 determines that an arc fault has not occurred.

As illustrated in FIG. 2C, in the third determination example, the duration of the determination by determination unit 13 that an arc has occurred is longer than the second threshold value (threshold time Th1). In the third determination example, determination unit 13 determines that an arc caused by a disconnection or partial disconnection in power line L1 has occurred, i.e., that an arc fault has occurred, without referencing the communication status obtained by second obtainment unit 12. In this way, when determination unit 13 has determined, for the second threshold (threshold time Th1) amount of time or longer, that an arc fault has occurred based on a measurement result obtained by first obtainment unit 11, it determines that an arc fault has occurred regardless of the operation information obtained by second obtainment unit 12.

Notification unit 14 notifies the surrounding area that an arc fault has occurred by, for example, lighting a lamp or sounding a buzzer. Notification unit 14 may also notify that an arc fault has occurred by transmitting information indicating such to an information terminal of the owner or manager of arc detection system 100. Information terminals can include, for example, portable terminals such as smartphones or tablets, as well as personal computers.

Shutoff unit 15 stops the current flowing in power line L1 when determination unit 13 determines that an arc fault has occurred. This extinguishes any arc discharge that may have occurred due to the arc fault.

For example, shutoff unit 15 stops the current flowing in power line L1 by controlling a switch connected to power line L1. The switch is, for example, a mechanical or semiconductor switch. Examples of mechanical switches include relays and breakers, and examples of semiconductor switches include transistors and diodes.

The switch connected to power line L1 may be a switch directly connected to power line L1 or indirectly connected to power line L1. For example, the switch is a switch that realizes the AC/DC conversion function in AC/DC converter 21. Even though the switch is not directly connected to power line L1, it is indirectly connected to power line L1, and thus is considered a switch connected to power line L1. For example, shutoff unit 15 stops the current flowing in power line L1 by controlling the switch to stop the switching operation of the switch.

The switch may be configured to turn power supply 2 on and off. In such cases, shutoff unit 15 stops the current flowing in power line L1 by controlling the switch to turn power supply 2 off.

The switch may be provided on power line L1, and the switch may be configured to open or close power line L1. For example, shutoff unit 15 may stop the current flowing in power line L1 by controlling the switch to open power line L1.

[Operations]

Figure 3:
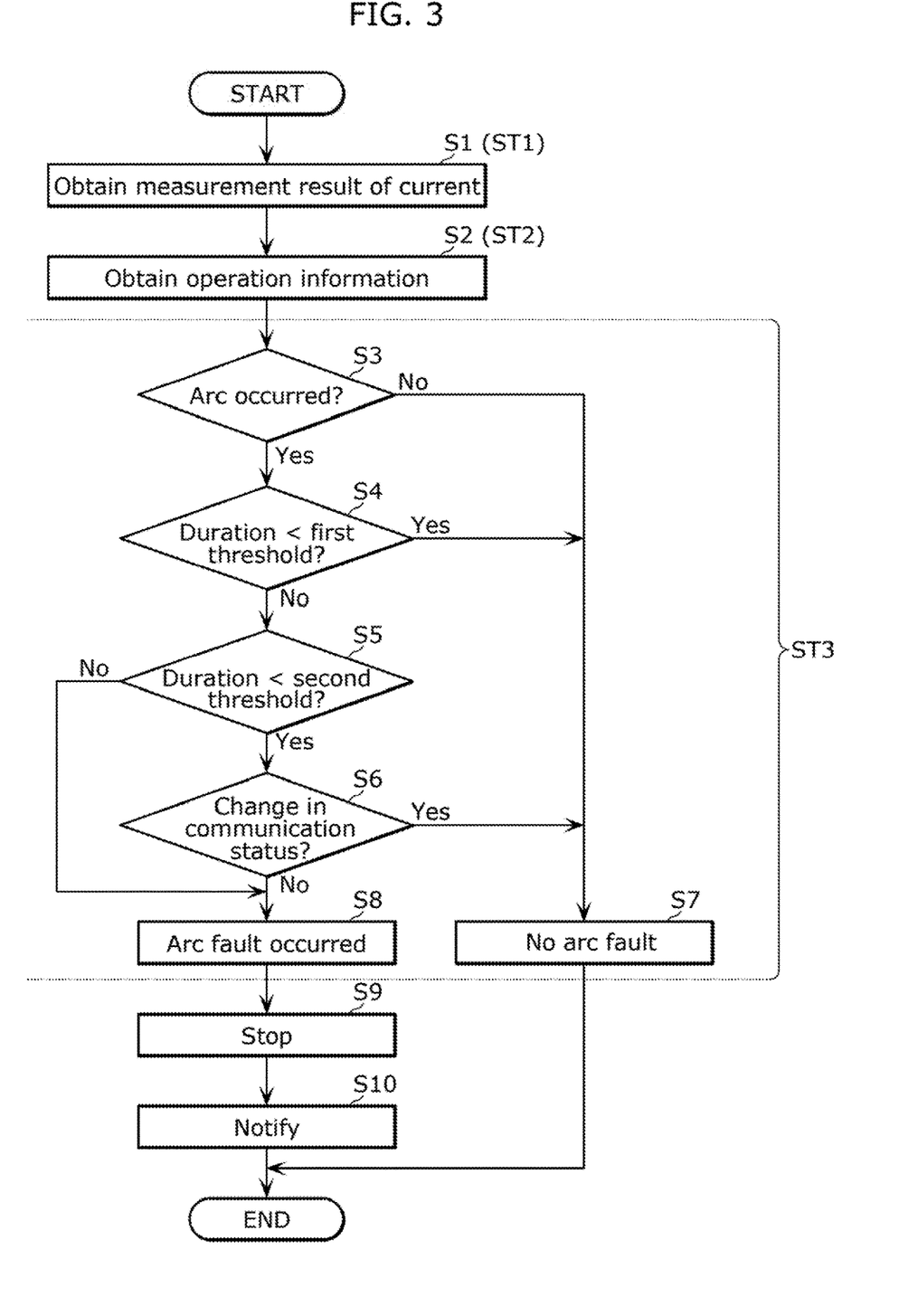
FIG. 3 is a flowchart illustrating an operation example of the arc detection system according to Embodiment 1.

Hereinafter, one example of arc detection system 100 according to Embodiment 1 will be described with reference to FIG. 3. FIG. 3 is a flowchart illustrating an operation example of arc detection system 100 according to Embodiment 1.

First, first obtainment unit 11 obtains the measurement result of current I1 from current meter 22 at predetermined intervals (S1). Process S1 corresponds to first obtainment step ST1 of the arc detection method. Next, second obtainment unit 12 obtains the communication status with (i.e., the operation information of) each device 3 by waiting for signals from each device 3 (S2). Process S2 corresponds to second obtainment step ST2 of the arc detection method. Then, determination unit 13 first determines whether or not an arc has occurred based on components in a specific frequency band of the measurement result of current I1 obtained by first obtainment unit 11 (S3). Here, determination unit 13 performs a frequency analysis of the measurement result of current I1 obtained by first obtainment unit 11 to make the determination.

If determination unit 13 determines that an arc has occurred (Yes in S3), it monitors the duration of the determination that an arc has occurred (S4). However, if determination unit 13 determines that no arc has occurred (No in S3), it determines that no arc fault has occurred (S7).

When determination unit 13 determines that an arc has occurred, if the duration is less than the first threshold (Yes in S4), determination unit 13 determines that no arc fault has occurred (S7). If the duration is greater than or equal to the second threshold (No in S4, No in S5), determination unit 13 determines that an arc fault has occurred (S8). However, if the duration is greater than or equal to the first threshold (No in S4) and less than the second threshold (Yes in S5), determination unit 13 references the communication status obtained by second obtainment unit 12 to monitor whether there is a difference in the communication status with each device 3 before and after determination time t1 (S6).

If there is a difference in the communication status with any device 3 before and after determination time t1 (Yes in S6), determination unit 13 determines that an arc fault has not occurred (S7). However, if there is no difference in the communication status with any device 3 before and after determination time t1 (No in S6), determination unit 13 determines that an arc fault has occurred (S8). Processes S3 through S8 correspond to determination step ST3 of the arc detection method.

If determination unit 13 determines that an arc fault has occurred (S8), shutoff unit 15 stops the power supply from power supply 2 to power line L1 by stopping the current flowing in power line L1 (S9). Notification unit 14 then notifies of the occurrence of the arc fault (S10). However, if determination unit 13 determines that no arc fault has occurred (S7), arc detection system 100 ends the process. The above series of processes S1 through S10 are thereafter repeated.

Advantages

Hereinafter, the advantages of arc detection system 100 according to Embodiment 1 will be explained by way of comparison with a comparative arc detection system. The comparative arc detection system differs from arc detection system 100 according to Embodiment 1 in that it does not include second obtainment unit 12. Stated differently, the comparative arc detection system differs from arc detection system 100 according to Embodiment 1 in that it immediately determines that an arc fault has occurred when the measurement result of current I1 obtained by first obtainment unit 11 contains a first predetermined value of specific frequency band components or more.

First, conditions required for an arc detection system will be described. If an arc occurs due to a disconnection or partial disconnection in power line L1 and is left unattended, the disconnected or partially disconnected part may generate excessive heat and possibly ignite, leading to a fire. It is therefore important for the arc detection system to detect the occurrence of arcs (i.e., arc faults) as soon as possible and to stop the supply of power to power line L1 before the situation escalates to a point where a fire can occur. For example, the Underwriters Laboratories (UL) standard requires that arc faults be detected within 2 seconds of occurrence of an arc.

Although the comparative arc detection system is capable of detecting the occurrence of arc faults, it determines that an arc fault has occurred not only when an arc is caused by a disconnection or partial disconnection in power line L1, but also when an arc is caused by chattering. Stated differently, the comparative arc detection system incorrectly determines that an arc fault has occurred even when the arc is unlikely to cause an arc fault. In this way, the comparative arc detection system determines that an arc fault has occurred each time an arc occurs, which may be less user-friendly. For example, this could lead to the user being notified that an arc fault has occurred each time device 3 is attached to or detached from power line L1, which would be bothersome to the user. Assume, for example, that the comparative arc detection system is configured to automatically stop supplying power from power supply 2 to power line L1 when it determines that an arc fault has occurred. With this configuration, the supply of power to power line L1 is stopped each time device 3 is attached to or detached from power line L1, which is also bothersome to the user.

In contrast, since arc detection system 100 according to Embodiment 1 includes second obtainment unit 12, determination unit 13 can determine whether device 3 has been attached or detached by referencing its communication status with device 3 (i.e., by referencing the operation information). Arc detection system 100 according to Embodiment 1 therefore determines that an arc fault has occurred when an arc is caused by a disconnection or partial disconnection in power line L1, and generally does not determine that an arc fault has occurred when an arc is caused by chattering.

In other words, arc detection system 100 according to Embodiment 1 is unlikely to determine that an arc fault has occurred due to the occurrence of an arc that is unlikely to cause an arc fault. Stated differently, arc detection system 100 according to Embodiment 1 has the advantage that it is easier to prevent false detection of arc faults because it does not need to detect events which do not result in an arc fault if they occur only temporarily, such as arcs that may occur when attaching or detaching device 3 to or from power line L1. Therefore, with arc detection system 100 according to Embodiment 1, the above-described events that could possibly occur in the comparative arc detection system are not likely to occur. Stated differently, arc detection system 100 according to Embodiment 1 has the advantage of being user-friendly because it can notify the user or stop the supply of power to power line L1 only when an arc fault occurs, which is considered to be an event that has a particularly large impact on the user.

Embodiment 2

[Configuration]

Figure 4:
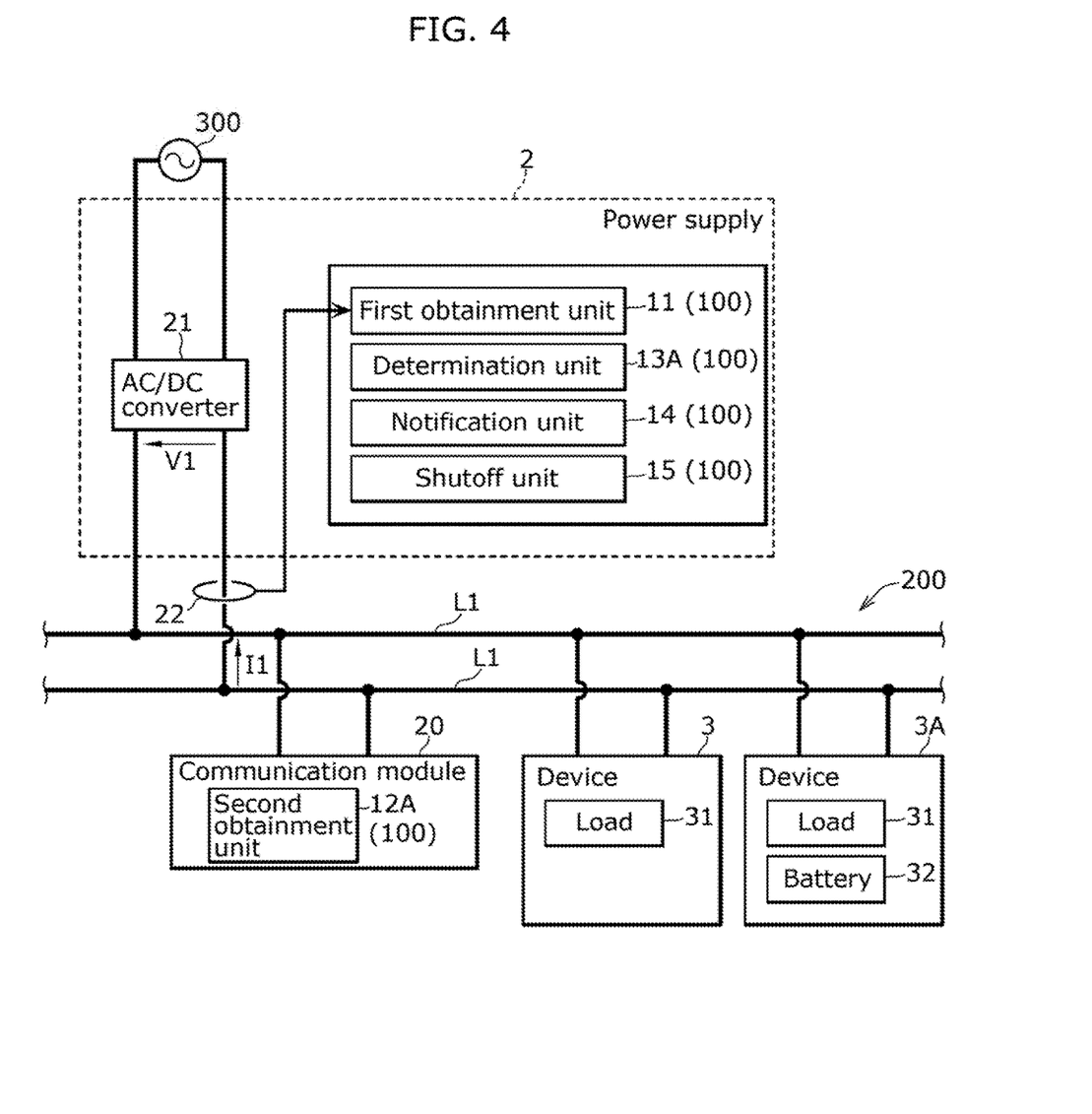
FIG. 4 is a diagram of the overall structure including an arc detection system according to Embodiment 2.

Hereinafter, arc detection system 100 according to Embodiment 2 will be described with reference to FIG. 4. FIG. 4 is a diagram of the overall structure including arc detection system 100 according to Embodiment 2. In arc detection system 100 according to Embodiment 2, the function of second obtainment unit 12A differs from the function of second obtainment unit 12 of arc detection system 100 according to Embodiment 1. In arc detection system 100 according to Embodiment 2, the function of determination unit 13A differs from the function of determination unit 13 of arc detection system 100 according to Embodiment 1. Furthermore, in Embodiment 2, in addition to device 3 according to Embodiment 1, device 3A including battery 32 can be connected to power line L1. Hereinafter, description will focus mainly on the differences from Embodiment 1, and similarities with Embodiment 1 will be omitted where appropriate.

Device 3A differs from device 3 according to Embodiment 1 in that it includes battery 32. Device 3A therefore differs from device 3 according to Embodiment 1 in that its function for communicating with second obtainment unit 12A is not driven by power line L1, but rather by battery 32. Accordingly, in Embodiment 2, device 3A can carry out its function for communicating with second obtainment unit 12A regardless of whether it is connected to power line L1 or not. Unlike second obtainment unit 12 according to Embodiment 1, second obtainment unit 12A further obtains, as the operation information, drive information indicating whether the function in device 3/3A for communicating with second obtainment unit 12A is driven by battery 32 or not. For example, second obtainment unit 12A broadcasts a request signal containing a command requesting drive information. In the case that device 3 receives the request signal, device 3 sends, to second obtainment unit 12A, a response signal including drive information indicating that it is not equipped with battery 32. In the case that device 3A receives the request signal, device 3A sends, to second obtainment unit 12A, a response signal including drive information indicating that it is equipped with battery 32. Second obtainment unit 12A receives the response signal, thereby obtaining drive information indicating whether or not the device is driven by battery 32.

If the user inputs the drive information of device 3/3A using, for example, a controller provided in arc detection system 100 or a remote controller, second obtainment unit 12A may obtain the input drive information. In such cases, second obtainment unit 12A can obtain the drive information without communicating with device 3/3A.

Unlike determination unit 13 according to Embodiment 1, determination unit 13A determines whether or not an arc fault has occurred in power line L1 without referencing the communication status when the function of device 3A for communicating with second obtainment unit 12A is driven by battery 32. Stated differently, determination unit 13A determines whether or not an arc fault has occurred by referencing the communication status obtained by second obtainment unit 12A as necessary for device 3, which does not include battery 32, just as in Embodiment 1. In contrast, for device 3A that includes battery 32, determination unit 13A determines whether or not an arc fault has occurred based solely on the measurement result obtained by first obtainment unit 11, without referencing the communication status obtained by second obtainment unit 12A.

For example, determination unit 13A does not reference the communication status obtained by second obtainment unit 12A for device 3A that includes battery 32 when the duration of the determination that an arc has occurred is greater than or equal to the first threshold and less than the second threshold. In such cases, determination unit 13A determines that an arc fault has occurred only when the duration is greater than or equal to the second threshold (threshold time Th1). [Advantages] Just like arc detection system 100 according to Embodiment 1, arc detection system 100 according to Embodiment 2 has the advantage that false detection of the occurrence of arc faults can be easily prevented. Arc detection system 100 according to Embodiment 2 also has the advantage that when the function in device 3A for communicating with second obtainment unit 12A is driven by battery 32, false detection of the occurrence of arc faults can be easily prevented by not referencing the communication status. Stated differently, since device 3A, which includes battery 32, can be driven by battery 32, it can communicate with arc detection system 100 even when it is not connected to power line L1. Therefore, if arc detection system 100 according to Embodiment 1 were to reference the communication status with device 3A, determination unit 13 may incorrectly determine that an arc fault has occurred because there would be no change in the communication status. In view of this, in arc detection system 100 according to Embodiment 2, determination unit 13A does not reference the communication status when device 3A is driven by battery 32 in order to avoid incorrectly determining that an arc fault has occurred as described above.

[Variations]

Although Embodiments 1 and 2 have been described above, the present invention is not limited to Embodiments 1 and 2. Hereinafter, examples of variations of Embodiments 1 and 2 will be given. The variations described below may be combined where appropriate.

In Embodiments 1 and 2, current meter 22 is provided as a separate device from arc detection system 100, but current meter 22 may be provided in arc detection system 100.

In Embodiments 1 and 2, second obtainment unit 12/12A communicates at regular intervals with devices 3/3A that are connected to power line L1 and operating, but this example is non-limiting. For example, second obtainment unit 12/12A may communicate with devices 3/3A on an irregular basis.

In Embodiments 1 and 2, arc detection system 100 is provided in power supply 2, but this example is non-limiting. For example, arc detection system 100 may be connected to power line L1 as a separate device from power supply 2. In such cases, if arc detection system 100 is configured to communicate with power supply 2 via wired, wireless, or power line communication, it is possible to give instructions to power supply 2 according to the determination results of determination unit 13/13A.

In Embodiments 1 and 2, determination unit 13/13A extracts components in a specific frequency band by performing frequency analysis on the measurement result of current I1 obtained by first obtainment unit 11, but this example is non-limiting. For example, instead of performing frequency analysis, determination unit 13/13A may extract frequency components in a specific frequency band by passing the measurement result of current I1 obtained by first obtainment unit 11 through a filter (for example, a bandpass filter).

In Embodiments 1 and 2, first obtainment unit 11 obtains the measurement result of current I1, but it may also obtain a measurement result of voltage V1. In such cases, first obtainment unit 11 obtains the measurement result of voltage V1 by sampling at predetermined intervals (i.e., on a sampling cycle) by a voltmeter instead of current meter 22. Stated differently, first obtainment unit 11 obtains the measurement result of voltage V1 from a voltmeter at predetermined intervals. The voltmeter is provided in power supply 2 and measures the voltage between the positive and negative power lines of power line L1 (i.e., measures voltage V1 in power line L1). The voltmeter does not need to be provided in power supply 2 and may be a separate device from power supply 2.

In such cases, determination unit 13/13A determines whether or not an arc is occurring based on components in a specific frequency band of the measurement result of voltage V1 obtained by first obtainment unit 11. More specifically, determination unit 13/13A performs a frequency analysis of the measurement result of voltage V1 obtained by first obtainment unit 11. Determination unit 13/13A then refers to the calculated frequency spectrum and determines that an arc has occurred if the measurement result of voltage V1 contains a first predetermined value of specific frequency band components or more. The specific frequency band is, for example, a band that includes the frequency of noise generated when an arc fault occurs. In one example, the specific frequency band is the band of tens of kHz, which is a relatively high frequency band. Note that the frequency of the noise generated in the above case can be obtained experimentally.

In Embodiments 1 and 2, second obtainment unit 12/12A is provided in communication module 20, which is connected to power line L1 separately from power supply 2, but this example is non-limiting. For example, second obtainment unit 12/12A may be provided in power supply 2. In such cases, communication module is not needed in arc detection system 100.

In Embodiments 1 and 2, determination unit 13/13A determines that an arc fault has occurred if the duration of the determination that an arc has occurred is greater than or equal to the second threshold (threshold time Th1), regardless of the operation information obtained by second obtainment unit 12/12A, but this example is non-limiting. For example, determination unit 13/13A may determine that an arc fault has occurred if the measurement result contains a second predetermined value of specific frequency band components or more (second predetermined value>first predetermined value), regardless of the operation information obtained by second obtainment unit 12/12A.

In Embodiments 1 and 2, arc detection system 100 is used in DC distribution network 200, but this example is non-limiting. For example, arc detection system 100 may be used in an AC distribution network. In such cases, power supply 2 is an AC power supply.

For example, the present invention can be realized not only as arc detection system 100, but also as an arc detection method that includes steps (processes) performed by elements of arc detection system 100.

More specifically, the arc detection method includes first obtainment step ST1, second obtainment step ST2, and determination step ST3. In first obtainment step ST1, a measurement result of current I1 flowing in power line L1 or voltage V1 in power line L1 to which power is supplied from power supply 2 is obtained. In second obtainment step ST2, operation information about the operation of devices 3 connected to power line L1 is obtained. In determination step ST3, whether or not an arc fault has occurred in power line L1 is determined based on the measurement result obtained in first obtainment step ST1 and the operation information obtained in second obtainment step ST2.

For example, these steps may be performed by a computer (a computer system) including one or more processors. The present invention can be realized as a program for causing the computer to execute the steps included in the method. The present invention can further be realized as a non-transitory computer-readable recording medium, such as a CD-ROM, recorded with the program. More specifically, the program causes one or more processors to execute the arc detection method described above.

Although at least part of arc detection system 100 in each of the above embodiments is realized as software in a microcontroller, it may also be realized as software in a general-purpose computer such as a personal computer. Furthermore, at least part of arc detection system 100 may be realized as hardware via dedicated electronic circuitry of A/D converters, logic circuits, gate arrays, D/A converters, etc.

Although only some exemplary embodiments of the present invention have been described in detail above, those skilled in the art will readily appreciate that many modifications are possible in the exemplary embodiments without materially departing from the novel teachings and advantages of the present invention. Accordingly, all such modifications are intended to be included within the scope of the present invention.

CONCLUSION

As described above, arc detection system 100 includes first obtainment unit 11, second obtainment unit 12/12A, and determination unit 13/13A. First obtainment unit 11 obtains a measurement result of current I1 flowing in power line L1 or voltage V1 in power line L1 to which power is supplied from power supply 2. Second obtainment unit 12/12A obtains operation information about the operation of devices 3/3A connected to power line L1.

Determination unit 13/13A determines whether or not an arc fault has occurred in power line L1 based on components in a specific frequency band of the measurement result obtained by first obtainment unit 11 and the operation information obtained by second obtainment unit 12/12A.

Arc detection system 100 configured in such a manner has the advantage that it is easier to prevent false detection of arc faults because it does not need to detect events which do not result in an arc fault if they occur only temporarily, such as arcs that may occur when attaching or detaching device 3/3A to or from power line L1.

For example, in arc detection system 100, the operation information indicates the communication status of device 3/3A.

When determination unit 13/13A determines that an arc has occurred based on the measurement result obtained by first obtainment unit 11 and there is a difference in the communication status indicated in the operation information before and after the determination, determination unit 13/13A determines that an arc fault has not occurred.

According to arc detection system 100 configured in this manner, it is easy to detect the attachment or detachment of device 3/3A to or from power line L1 by referencing the communication status with device 3/3A. This has the advantage that it is easy to prevent false detection of the occurrence of arc faults.

For example, in arc detection system 100, second obtainment unit 12A further obtains, as the operation information, drive information indicating whether the function in device 3/3A for communicating with second obtainment unit 12A is driven by battery 32 or not. Determination unit 13A determines whether or not an arc fault has occurred in power line L1 without referencing the communication status when the function of device 3A for communicating with second obtainment unit 12A is driven by battery 32.

Such arc detection system 100 has the advantage that it does not reference the communication status with device 3A driven by battery 32, which makes it easier to prevent false detection of no attachment or detachment of device 3A to power line L1.

For example, in arc detection system 100, when determination unit 13/13A has determined, for a threshold amount of time Th1 or longer, that an arc has occurred based on the measurement result obtained by first obtainment unit 11, determination unit 13/13A determines that the arc fault has occurred regardless of the operation information obtained by second obtainment unit 12/12A.

Arc detection system 100 configured in such a manner has the advantage that it is easier to determine that an arc fault has occurred at an early stage compared to when the operation information is referenced.

For example, the arc detection method includes first obtainment step ST1, second obtainment step ST2, and determination step ST3. In first obtainment step ST1, a measurement result of current I1 flowing in power line L1 or voltage V1 in power line L1 to which power is supplied from power supply 2 is obtained. In second obtainment step ST2, operation information about the operation of devices 3/3A connected to power line L1 is obtained. In determination step ST3, whether or not an arc fault has occurred in power line L1 is determined based on the measurement result obtained in first obtainment step ST1 and the operation information obtained in second obtainment step ST2.

Such an arc detection method has the advantage that it is easier to prevent false detection of arc faults because it does not need to detect events which do not result in an arc fault if they occur only temporarily, such as arcs that may occur when attaching or detaching device 3/3A to or from power line L1.

For example, a non-transitory computer-readable recording medium has recorded thereon a program for causing one or more processors to execute the arc detection method described above.

Such a recording medium has the advantage that it is easier to prevent false detection of arc faults because it does not need to detect events which do not result in an arc fault if they occur only temporarily, such as arcs that may occur when attaching or detaching device 3/3A to or from power line L1.

The invention claimed is:

1. An arc detection system comprising:
a first obtainment unit configured to obtain a measurement result of current flowing in a power line to which power is supplied from a power supply or a measurement result of voltage in the power line;
a second obtainment unit configured to obtain operation information about operation of a device connected to the power line; and
a determination unit configured to determine whether or not an arc fault has occurred in the power line based on the measurement result obtained by the first obtainment unit and the operation information obtained by the second obtainment unit,
wherein the operation information indicates a communication status with the device, and
when the determination unit determines that an arc has occurred based on the measurement result obtained by the first obtainment unit and there is a difference in the communication status indicated in the operation information before and after the determination, the determination unit is configured to determine that the arc fault has not occurred.

2. The arc detection system according to claim 1, wherein the second obtainment unit is configured to further obtain, as the operation information, drive information indicating whether a function in the device for communicating with the second obtainment unit is driven by a battery or not, and
when the function in the device for communicating with the second obtainment unit is driven by the battery, the determination unit is configured to determine whether or not an arc fault has occurred in the power line without referencing the communication status.

3. An arc detection system comprising:
a first obtainment unit configured to obtain a measurement result of current flowing in a power line to which power is supplied from a power supply or a measurement result of voltage in the power line;
a second obtainment unit configured to obtain operation information about operation of a device connected to the power line; and
a determination unit configured to determine whether or not an arc fault has occurred in the power line based on the measurement result obtained by the first obtainment unit and the operation information obtained by the second obtainment unit,
wherein when the determination unit has determined, for a threshold amount of time or longer, that an arc has occurred based on the measurement result obtained by the first obtainment unit, the determination unit is configured to determine that the arc fault has occurred regardless of the operation information obtained by the second obtainment unit.

4. An arc detection method comprising:
obtaining a measurement result of current flowing in a power line to which power is supplied from a power supply or a measurement result of voltage in the power line;
obtaining operation information about operation of a device connected to the power line; and
determining whether or not an arc fault has occurred in the power line based on the measurement result obtained and the operation information obtained,
wherein the operation information indicates a communication status with the device, and
the determining includes, when it is determined that an arc has occurred based on the measurement result obtained in the obtaining of a measurement result and there is a difference in the communication status indicated in the operation information before and after the determination, determining that the arc fault has not occurred.

5. A non-transitory computer-readable recording medium having recorded thereon a program for causing one or more processors to execute the arc detection method according to claim 4.

6. An arc detection method comprising:
obtaining a measurement result of current flowing in a power line to which power is supplied from a power supply or a measurement result of voltage in the power line;
obtaining operation information about operation of a device connected to the power line; and
determining whether or not an arc fault has occurred in the power line based on the measurement result obtained and the operation information obtained, wherein
the determining includes, when it is determined, for a threshold amount of time or longer, that an arc has occurred based on the measurement result obtained in the obtaining of a measurement result, determining that the arc fault has occurred regardless of the operation information obtained in the obtaining of operation information.

7. A non-transitory computer-readable recording medium having recorded thereon a computer program for causing one or more processors to execute the arc detection method according to claim 6.

* * * * *